(12) United States Patent
Cho et al.

(10) Patent No.: US 9,027,576 B2
(45) Date of Patent: May 12, 2015

(54) SUBSTRATE TREATMENT SYSTEMS USING SUPERCRITICAL FLUID

(71) Applicants: Yong-Jhin Cho, Hwaseong-si (KR); Yongsun Ko, Suwon-si (KR); Kyoungseob Kim, Suwon-si (KR); Kwangsu Kim, Seoul (KR); SeokHoon Kim, Seongnam-si (KR); Jung-Min Oh, Incheon (KR); Kuntack Lee, Suwon-si (KR); Wonho Jang, Yongin-si (KR); Yongmyung Jun, Hwaseong-si (KR)

(72) Inventors: Yong-Jhin Cho, Hwaseong-si (KR); Yongsun Ko, Suwon-si (KR); Kyoungseob Kim, Suwon-si (KR); Kwangsu Kim, Seoul (KR); SeokHoon Kim, Seongnam-si (KR); Jung-Min Oh, Incheon (KR); Kuntack Lee, Suwon-si (KR); Wonho Jang, Yongin-si (KR); Yongmyung Jun, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 118 days.

(21) Appl. No.: 13/844,149

(22) Filed: Mar. 15, 2013

(65) Prior Publication Data

US 2014/0262024 A1    Sep. 18, 2014

(30) Foreign Application Priority Data

Mar. 12, 2013   (KR) ........................ 10-2013-0026254

(51) Int. Cl.
*H01L 21/67*   (2006.01)

(52) U.S. Cl.
CPC .... *H01L 21/67017* (2013.01); *H01L 21/67051* (2013.01); *H01L 21/6708* (2013.01)

(58) Field of Classification Search
None
See application file for complete search history.

(56) References Cited

U.S. PATENT DOCUMENTS

| | | | |
|---|---|---|---|
| 6,493,964 B1 | 12/2002 | Tousimis et al. | |
| 6,508,259 B1 | 1/2003 | Tseronis et al. | |
| 6,562,146 B1 | 5/2003 | Deyoung et al. | |
| 6,678,968 B1 | 1/2004 | Tousimis et al. | |
| 6,804,900 B2 | 10/2004 | Kawakami et al. | |

(Continued)

FOREIGN PATENT DOCUMENTS

| | | | |
|---|---|---|---|
| JP | 2002313773 A | 10/2002 | |
| JP | 2003109933 A | 4/2003 | |

(Continued)

OTHER PUBLICATIONS

European Search Report for EP Application No. 14158323.7, mailed Apr. 14, 2014.

*Primary Examiner* — Michael Barr
*Assistant Examiner* — Rita Adhlakha
(74) *Attorney, Agent, or Firm* — Renaissance IP Law Group LLP

(57) ABSTRACT

Substrate treatment systems are provided. The substrate treatment systems may include a treating device configured to treat a substrate with a supercritical fluid, and a supplying device configured to supply the supercritical fluid to the treating device. The treating device may include a supercritical process zone in which the substrate is treated with the supercritical fluid, and a pre-supercritical process zone in which the supercritical fluid is expanded and then provided into the supercritical process zone to create a supercritical state in the supercritical process zone.

8 Claims, 20 Drawing Sheets

(56) References Cited

U.S. PATENT DOCUMENTS

| | | | |
|---|---|---|---|
| 6,857,200 | B1 | 2/2005 | Tousimis et al. |
| 7,000,621 | B1 | 2/2006 | Verhaverbeke |
| 7,008,853 | B1 | 3/2006 | Dupont et al. |
| 7,323,064 | B2 | 1/2008 | Basceri et al. |
| 7,503,334 | B1 | 3/2009 | Shrinivasan et al. |
| 7,604,011 | B2 | 10/2009 | Redeker et al. |
| 7,918,940 | B2 * | 4/2011 | An et al. ............... 118/719 |
| 2004/0031441 | A1 | 2/2004 | Muraoka et al. |
| 2004/0038060 | A1 | 2/2004 | Kawakami et al. |
| 2004/0038532 | A1 | 2/2004 | Kawakami et al. |
| 2005/0028927 | A1 | 2/2005 | Basceri et al. |
| 2007/0119477 | A1 | 5/2007 | Redecker et al. |
| 2007/0144555 | A1 | 6/2007 | Chen et al. |
| 2011/0000507 | A1 * | 1/2011 | Toshima et al. ............ 134/19 |
| 2011/0186089 | A1 | 8/2011 | Je et al. |
| 2011/0214694 | A1 | 9/2011 | Toshima et al. |
| 2012/0048304 | A1 | 3/2012 | Kitajima et al. |
| 2012/0064727 | A1 | 3/2012 | Oh et al. |
| 2013/0145640 | A1 * | 6/2013 | Lee et al. ............... 34/201 |

FOREIGN PATENT DOCUMENTS

| | | |
|---|---|---|
| JP | 2004079966 A | 3/2004 |
| JP | 2004140321 A | 5/2004 |
| JP | 2004202351 A | 7/2004 |
| JP | 2004363404 A | 12/2004 |
| JP | 2006130418 A | 5/2006 |
| JP | 2006254814 A | 9/2006 |
| JP | 2006294662 A | 10/2006 |
| JP | 2008066495 A | 3/2008 |
| JP | 2008084890 A | 4/2008 |
| JP | 2008130685 A | 6/2008 |
| JP | 2009004596 A | 1/2009 |
| KR | 1020040073584 | 8/2004 |
| KR | 1020070008703 | 1/2007 |
| KR | 100757850 B1 | 9/2007 |
| KR | 100875586 B1 | 12/2008 |
| KR | 100964970 B1 | 6/2010 |
| KR | 101096122 B1 | 12/2011 |
| WO | 0122016 A | 3/2001 |
| WO | 03009932 A1 | 2/2003 |
| WO | 03107396 A | 12/2003 |

* cited by examiner

Supercritical Fluid Injection

SUBSTRATE TREATMENT SYSTEMS USING SUPERCRITICAL FLUID

CROSS-REFERENCE TO RELATED APPLICATIONS

This U.S. non-provisional patent application claims priority under 35 U.S.C. §119 to Korean Patent Application No. 10-2013-0026254, filed on Mar. 12, 2013, the entirety of which is incorporated by reference herein.

BACKGROUND

The inventive concept relates to substrate treatment systems and, more particularly, to substrate treatment systems capable of performing a supercritical process.

A supercritical fluid is any substance at a temperature and pressure above its critical point, where distinct liquid and gas phases do not exist. Thus, it has properties of a gas and a liquid. Supercritical processes using the supercritical fluid may be used in the semiconductor industry to obtain various advantages. For example, the supercritical processes may be used for a substrate drying process, a cleaning process, and/or an etching process. When a high-pressure supercritical fluid is supplied into a process chamber, it may rapidly expand. As a result, the temperature and the solubility of the supercritical fluid may be reduced such that a small amount of impurities included in the supercritical fluid may be undesirably condensed or deposited. The condensed or deposited impurities may re-contaminate a substrate. Thus, particle management may be important during the supercritical processes.

SUMMARY

Embodiments of the inventive concept may provide substrate treatment systems using supercritical fluid for substantially reducing contaminating particles or impurities.

Embodiments of the inventive concept may also provide substrate treatment systems capable of improving supercritical process capability.

Embodiments of the inventive concept may also provide substrate treatment systems capable of performing a supercritical process with reduced deterioration of the properties of the supercritical fluid.

In one embodiment, an apparatus for treating a substrate including: a pre-supercritical process zone to receive a supercritical fluid therein; and a supercritical process zone in fluid communication with the pre-supercritical process zone, the supercritical process zone configured to enable treating a substrate therein using the supercritical fluid. The pre-supercritical process zone is arranged and structured to permit expansion of the supercritical fluid before the supercritical fluid reaches the supercritical process zone, and the pre-supercritical process zone and the supercritical process zones are divided from each other.

According to one aspect of the present inventive concepts, a substrate treatment system may include a treating device configured to treat a substrate with a supercritical fluid and a supplying device configured to supply the supercritical fluid to the treating device. The treating device may include a supercritical process zone in which the substrate is treated with the supercritical fluid and a pre-supercritical process zone in which the supercritical fluid is expanded and then provided into the supercritical process zone to create a super-critical state in the supercritical process zone.

In one embodiment, the pre-supercritical process zone may have a smaller volume the pre-supercritical process zone may have a smaller volume than the supercritical process zone than the supercritical process zone.

The treating device may include a process chamber having the supercritical process zone and the pre-supercritical process zone formed therein.

The substrate treatment system may further include: a first supply pipe connected to the pre-supercritical process zone and configured to supply the supercritical fluid from the supplying device to the pre-supercritical process zone; a second supply pipe connected to the supercritical process zone and configured to supply the supercritical fluid from the supplying device to the supercritical process zone; and an exhaust pipe connected to the pre-supercritical process zone and configured to exhaust a contaminated supercritical fluid from the process chamber.

In another embodiment, the substrate treatment system may include: a first pipe connected to the pre-supercritical process zone to supply the supercritical fluid from the supplying device into the pre-supercritical process zone and to exhaust a contaminated supercritical fluid from the process chamber; and a second pipe connected to the supercritical process zone to supply the supercritical fluid from the supplying device into the supercritical process zone.

In another embodiment, the substrate treatment system may include: a supply pipe connected to the pre-supercritical process zone to supply the supercritical fluid from the supplying device to the process chamber; and an exhaust pipe connected to the pre-supercritical process zone to exhaust a contaminated supercritical fluid from the process chamber.

The supercritical process zone may include: a top surface and a bottom surface facing each other; and a sidewall connected between the top surface and the bottom surface. A portion of one or more of the top surface, the bottom surface, and the sidewall of the supercritical process zone may be recessed to define the pre-supercritical process zone.

In one embodiment, a portion of the bottom surface of the supercritical process zone may be recessed to define the pre-supercritical process zone. The process chamber may further include: a plurality of supporting parts disposed on the bottom surface; and a blocking plate disposed on the supporting parts and spaced apart from the bottom surface, wherein the blocking plate divides an internal region of the process chamber into the pre-supercritical process zone and the supercritical process zone.

In another embodiment, the bottom surface of the supercritical process zone may be inclined downward to form the pre-supercritical process zone.

In another embodiment, the pre-supercritical process zone may include a sidewall extending upward from the bottom surface. The upwardly extending sidewall of the pre-supercritical process zone may be inclined to form the supercritical process zone.

In another embodiment, the pre-supercritical process zone may surround a sidewall of the supercritical process zone.

In another embodiment, a portion of the bottom surface of the supercritical process zone may be recessed to define the pre-supercritical process zone; a width of the pre-supercritical process zone may become progressively reduced toward the supercritical process zone; and the pre-supercritical process zone may include a passage opened toward the supercritical process zone.

In an embodiment, the treating device may include: a process chamber having the supercritical process zone; and an expansion chamber having the pre-supercritical process zone and spaced apart from the process chamber.

In an embodiment, the substrate treatment system may further include: a first supply pipe connected to the expansion chamber to supply the supercritical fluid from the supplying device into the pre-supercritical process zone; a second supply pipe connected to the process chamber to supply the supercritical fluid from the supplying device into the supercritical process zone; a middle pipe provided between the process chamber and the expansion chamber to guide movement of the supercritical fluid and movement of a contaminated supercritical fluid; and an exhaust pipe connected to the expansion chamber to exhaust the contaminated supercritical fluid from the treating device.

In an embodiment, the substrate treatment system may further include at least one of the following: a buffer tank provided between the supplying device and the treating device; a co-solvent storage tank provided between the supplying device and the treating device; a co-solvent supplying device including a mixer mixing a co-solvent and the supercritical fluid; a recovery tank configured to store a supercritical fluid exhausted from the treating device; and a regeneration device to configured to regenerate a supercritical fluid containing a contaminator which is exhausted from the treating device into a liquid fluid from which impurities are removed.

In another aspect, a substrate treatment system may include: a supplying device configured to store a supercritical fluid; and a treating device including a first zone first into which the supercritical fluid is first supplied and a second zone into which the supercritical fluid is second supplied. The first zone may first expand the first supplied supercritical fluid to filter impurities of the first supplied supercritical fluid; the filtered supercritical fluid may be supplied into the second zone to create a supercritical state in the second zone; and a substrate may be treated by the second supplied supercritical fluid in the second zone of the supercritical state.

In an embodiment, the first zone may have a first volume for the first expanding of the first supplied supercritical fluid; the second zone may have a second volume for second expanding the first expanded supercritical fluid; and the second volume may be greater than the first volume.

In an embodiment, the first volume may have a range of about 5% to about 20% of the second volume.

In an embodiment, the treating device may include a process chamber having the second zone therein; and the first zone may occupy a portion of an internal region of the process chamber.

In an embodiment, the substrate treatment system may further include: a blocking plate covering the first zone and dividing the internal region of the process chamber into the first zone and the second zone. The blocking plate may form a passage through which the filtered supercritical fluid flows from the first zone to the second zone; and the passage may function as an expansion nozzle for second expanding the filtered supercritical fluid.

In an embodiment, the first zone may include a passage opened toward the second zone; and the passage of the first zone may function as an expansion nozzle for second expanding the filtered supercritical fluid.

In an embodiment, the substrate treatment system may further include: a main supply pipe connected to the supplying device to supply the supercritical fluid to the process chamber; and a first supply pipe and a second supply pipe diverging from the main supply pipe and connected to the process chamber. The first supply pipe may be connected to the first zone to first supply the supercritical fluid into the first zone; and the second supply pipe may be connected to the second zone to second supply the supercritical fluid into the second zone.

In an embodiment, the substrate treatment system may further include: an exhaust pipe connected to the first zone and exhausting a contaminated supercritical fluid from the process chamber.

In an embodiment, the first supply pipe may further provide a path exhausting a contaminated supercritical fluid from the process chamber.

In an embodiment, the substrate treatment system may further include: a supply pipe connected to the supplying device and the first zone; and an exhaust pipe connected to the first zone. The supply pipe may supply the first supplied supercritical fluid and the second supplied supercritical fluid into the first zone; and the exhaust pipe may exhaust a contaminated supercritical fluid from the process chamber.

In an embodiment, the treating device may include: a process chamber having the second zone; an expansion chamber having the first zone and spaced apart from the process chamber; and a middle pipe provided between the expansion chamber and the process chamber to guide the filtered supercritical fluid from the first zone to the second zone. The middle pipe may function as an expansion nozzle for second expanding the filtered supercritical fluid.

In an embodiment, the substrate treatment system may further include: a main supply pipe connected to the supplying device to supply the supercritical fluid to the treating device; a first supply pipe diverging from the main supply pipe and connected to the expansion chamber to first supply the supercritical fluid into the first zone; a second supply pipe diverging from the main supply pipe and connected to the process chamber to second supply the supercritical fluid into the second zone; and an exhaust pipe connected to the treating device to exhaust a contaminated supercritical fluid from the treating device.

In still another aspect, a substrate treatment system may include: a treating device including a first zone to which a first supercritical fluid is supplied, a second zone to which a second supercritical fluid is supplied, and a passage through which the first supercritical fluid is supplied from the first zone into the second zone, the passage being disposed between the first zone and the second zone. The first zone may have a first volume where the first supercritical fluid is initially expanded to condense and filter impurities contained in the first semiconductor device. The second zone may have a second volume where the filtered first supercritical fluid is supplied through the passage and then expanded again such that a supercritical state is created in the second zone. The second volume may be greater than the first volume; and the passage may function as an expansion nozzle for the second expanding of the filtered first semiconductor device.

In an embodiment, a substrate may be loaded into the second zone and then be treated by the second supercritical fluid in the supercritical state.

In an embodiment, a contaminated second supercritical fluid after treating the substrate may pass through the first zone and then be exhausted from the treating device; and the condensed impurities may be exhausted from the first zone along with the contaminated second supercritical fluid.

In an embodiment, an exhausting path of the contaminated second supercritical fluid from the first zone may be different from a supplying path of the first supercritical fluid to the first zone.

In an embodiment, the first supercritical fluid may be formed of the same material as the second supercritical fluid.

In an embodiment, the substrate treatment system may further include: a co-solvent supplying device configured to supply a co-solvent into the treating device. The co-solvent may be mixed with the second supercritical fluid, and the mixture of the co-solvent and the second supercritical fluid may be supplied into the second zone.

In an embodiment, the first zone and the second zone may be disposed in one chamber or be disposed in different chambers spaced apart from each other, respectively.

BRIEF DESCRIPTION OF THE DRAWINGS

The inventive concept will become more apparent in view of the attached drawings and accompanying detailed description.

DETAILED DESCRIPTION OF THE EMBODIMENTS

Figure 1A:
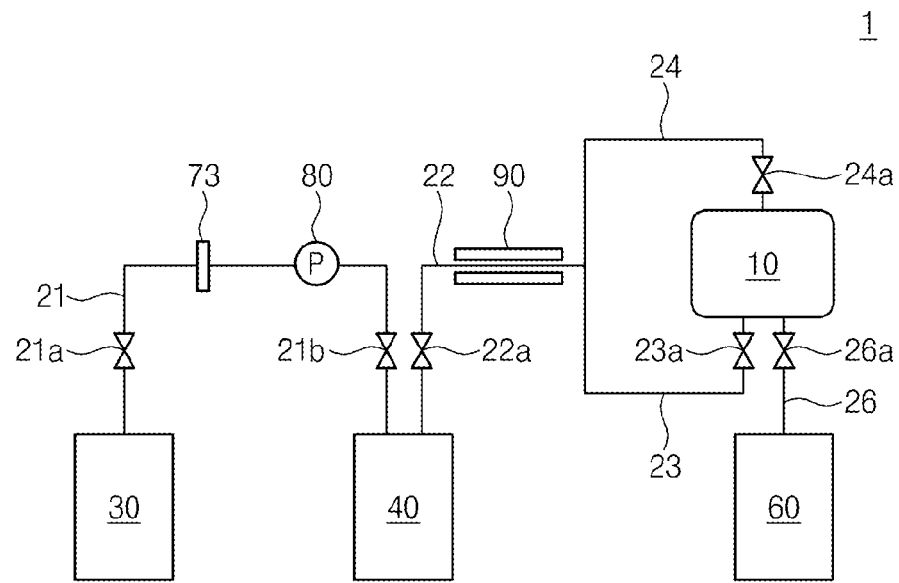
FIG. 1A is a schematic diagram illustrating a substrate treatment system according to an embodiment of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of an apparatus and are not intended to limit the scope of example embodiments.

[An Embodiment of a Substrate Treatment System]

FIG. 1A is a schematic diagram illustrating a substrate treatment system according to an embodiment of the inventive concept.

Referring to FIG. 1A, a substrate treatment system 1 may be an apparatus for performing a supercritical process to treat a substrate by a supercritical fluid. In the present disclosure, the supercritical process may mean a drying process where a wafer is dried after being subject to a cleaning or other wafer fabrication processes. The supercritical process may also mean a cleaning process where the wafer is cleaned using a supercritical fluid containing additives such as a surfactant after the certain wafer fabrication process. As discussed above, the supercritical fluid may be any substance at the temperature and pressure above its critical point, where distinct liquid and gas phases do not exist. The supercritical fluid may have properties between those of a gas and a liquid. For, example, the supercritical fluid may have diffusibility, viscosity, and surface tension equal to or similar to those of a gas. Additionally, the supercritical fluid may have solubility equal to or similar to that of a liquid. In general, the supercritical fluid may include $CO_2$, $H_2O$, $CH_4$, $C_2H_6$, $C_3H_8$, $C_2H_4$, $C_2H_2$, $C_2H_3OH$, $C_2H_5OH$, $SF_6$, or $C_3H_8O$.

In an embodiment, the substrate treatment system 1 may include a process chamber 10 where the supercritical process is performed and a supplying device 30 where at least one supercritical fluid is stored. The supercritical fluid may be supplied into the process chamber 10 from the supplying device 30. The supplying device 30 may pressurize and heat a fluid above its critical point to form the supercritical fluid, and then it may store the supercritical fluid therein. The substrate treatment system 1 may further include a buffer tank 40 for stably supplying the supercritical fluid into the process chamber 10. The substrate treatment system 1 may further include a first supply pipe 21, a second supply pipe 22, a third supply pipe 23, a fourth supply pipe 24, and an exhaust pipe 26. The first supply pipe 21 may have valves 21a and 21b which control the flow of the supercritical fluid from the supplying device 30 to the buffer tank 40. The second supply pipe 22 may have a valve 22a which controls the flow of the supercritical fluid from the buffer tank 40 to the process chamber 10. The third supply pipe 23 and the fourth supply pipe 24 may diverge from the second supply pipe 22 and be connected to the process chamber 10. The third supply pipe 23 and the fourth supply pipe 24 may have valves 23a and 24a, respectively. The exhaust pipe 26 may have a valve 26a for exhausting the supercritical fluid from the process chamber 10.

In an embodiment, the substrate treatment system 1 may further include a pump 80, a heating jacket 90, and a recovery tank 60. The pump 80 may be installed on the first supply pipe 21 to provide the supercritical fluid with a pressure. The heating jacket 90 may be installed on the second supply pipe 22 to provide the supercritical fluid with a heat so as to maintain a supercritical state of the supercritical fluid. The recovery tank 60 may store the supercritical fluid exhausted through the exhaust pipe 26.

In some embodiments, the substrate treatment system 1 may also include a condenser 73 upstream of the pump 80 such that the supercritical fluid can be condensed by the condenser 73 before the supercritical fluid is provided or injected to the process chamber 10. With the condenser 73, some of the impurities contained in the supercritical fluid may therefore be removed by condensation before the supercritical fluid reaches the process chamber 10.

In the present embodiment, the supercritical fluid may be sequentially supplied through the third supply pipe 23 and the fourth supply pipe 24 into the process chamber 10 to perform the supercritical process. For example, the supercritical fluid may be supplied through the third supply pipe 23 into the process chamber 10 so as to make the supercritical state in the process chamber 10, and then the supercritical fluid may be supplied through the fourth supply pipe 24 into the process chamber 10 so as to perform the supercritical process. If the supercritical process is performed after the internal environment of the process chamber 10 is changed into the supercritical state, it is possible to substantially reduce impurities or particles caused by expansion of the supercritical fluid. This will be described in more detail with reference to FIG. 1B. The supercritical fluid exhausted from the process chamber 10 through the exhaust pipe 26 may be released into the atmosphere or stored in the recovery tank 60.

[An Embodiment of a Process Chamber]

Figure 1B:
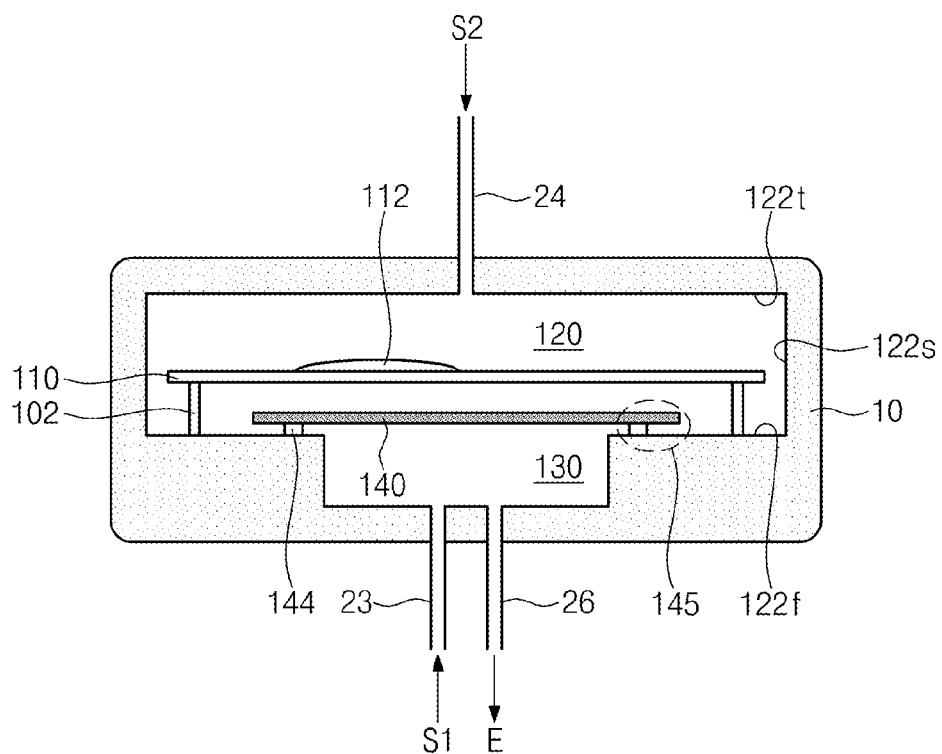
FIG. 1B is a cross-sectional view illustrating a process chamber in a substrate treatment system according to an embodiment of the inventive concept.
Figure 1C:
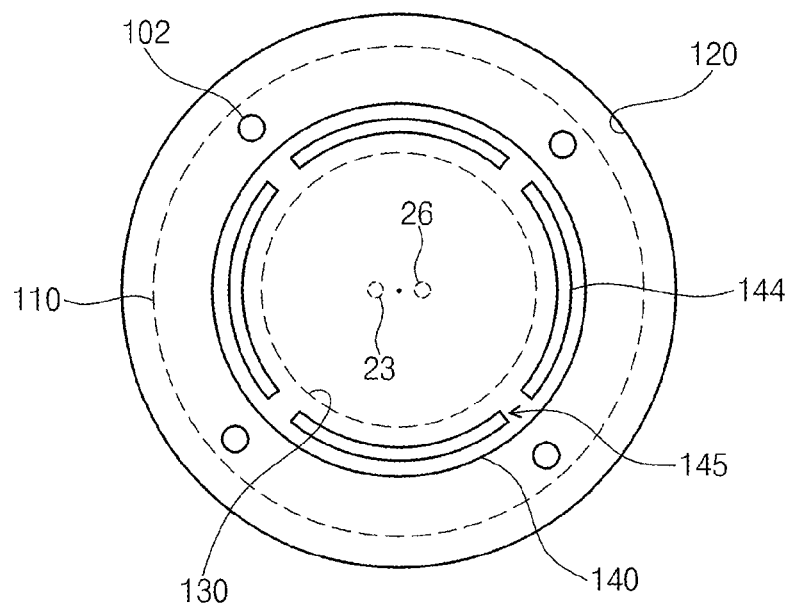
FIG. 1C is a plan view illustrating the inside of a process chamber in a substrate treatment system according to an embodiment of the inventive concept.

FIG. 1B is a cross-sectional view illustrating a process chamber in a substrate treatment system according to an embodiment of the inventive concept. FIG. 1C is a plan view illustrating the inside of a process chamber in a substrate treatment system according to an embodiment of the inventive concept.

Referring to FIGS. 1B and 1C, the process chamber 10 may include a pre-supercritical process zone 130 and a supercritical process zone 120. The third supply pipe 23 may be connected to the pre-supercritical process zone 130 for first supplying of the supercritical fluid and the exhaust pipe 26 may be connected to the pre-supercritical process zone 130 for exhausting of the supercritical fluid. The fourth supply pipe 24 may be connected to the supercritical process zone 120 for second supplying of the supercritical fluid. A substrate 110 may be provided into the supercritical process zone 120.

A portion of a bottom surface 122f of the supercritical process zone 120 or the bottom portion of the process chamber 10 may be recessed to define the pre-supercritical process zone 130. A blocking plate 140 may cover the pre-supercritical process zone 130. The blocking plate 140 may divide the internal region of the process chamber 10 into the pre-supercritical process zone 130 and the supercritical process zone 120. The blocking plate 140 may be supported by a plurality of supporting parts 144 disposed on the bottom surface 122f, so that the blocking plate 140 may be spaced apart from the bottom surface 122f. The blocking plate 140 may have a circular shape in plan view, and the supporting parts 144 may be disposed along a circumferential edge of the blocking plate 140 and be spaced apart from each other. Thus, one or more passages 145 may be defined by the blocking plate 140, the bottom surface 122f, and the supporting parts 144. The passage 145 may connect the pre-supercritical process zone 130 to the supercritical process zone 120. A plurality of supporting pins 102 may be provided on the bottom surface 122f along a circumferential edge of the substrate 110. The supporting pins 102 may be spaced apart from each other. The substrate 110 may be supported by the supporting pins 102.

Each of the pre-supercritical process zone 130 and the supercritical process zone 120 may have a volume of a circular cylinder-shape having a circular cross section in plan view. The pre-supercritical process zone 130 may have a volume smaller than that of the supercritical process zone 120. For example, the volume of the pre-supercritical process zone 130 may have a range of about 5% to about 20% of the volume of the supercritical process zone 120. A vertical distance of the passage 145 may be defined as a distance between the blocking plate 140 and the bottom surface 122f. The vertical distance of the passage 145 may have a range of about 0.1% to about 20.0%, more preferably, 1 to 10% of a sum of a height of the supercritical process zone 120 and a height of the pre-supercritical process zone 130. A horizontal distance of the passage 145 may be defined as a straight or circumferential distance between the supporting parts 144 adjacent to each other. The horizontal distance of the passage 145 may be equal to or similar to the vertical distance of the passage 145. The passage 145 may function as an expansion nozzle. However, the inventive concept is not limited to the shape and the numerical values of the elements described above.

In another embodiment, a portion of a top surface 122*t* of the supercritical process zone 120 may be recessed to define the pre-supercritical process zone 130. In still another embodiment, a portion of a sidewall 122*s* of the supercritical process zone 120 may be recessed to define the pre-supercritical process zone 130.

[An Embodiment of Substrate Treatment]

Referring to FIGS. 1A, 1B, and 1C, the substrate 110 may be loaded into the supercritical process zone 120, and then the supercritical fluid may be first supplied into the process chamber 10 to create the supercritical state in the process chamber 10. Subsequently, the supercritical fluid may be second supplied into the process chamber 10 to perform the supercritical process (e.g., a substrate drying process). The supercritical fluids may be supplied from the supplying device 30. The supercritical fluids may be the same material as each other. Alternatively, the first supplied supercritical fluid may be different from the second supplied supercritical fluid.

The substrate 110 may be provided into the supercritical process zone 120. For example, after the substrate 110 is cleaned, the substrate 110 may be provided into the supercritical process zone 120 for removing a cleaning solution remaining on the substrate 110. The substrate 110 may be a metal substrate, a semiconductor substrate, or an insulation substrate. For example, the substrate 110 may be a bare wafer, or a processed semiconductor wafer on which integrated circuits are formed.

The supercritical fluid (e.g., $CO_2$) provided from the supplying device 30 may be supplied into the pre-supercritical process zone 130 of the process chamber 10 through the third supply pipe 23 (S1). The supercritical fluid may be continuously supplied into the pre-supercritical process zone 130 until a flow rate of the supercritical fluid reaches a desired value. The pre-supercritical process zone 130 may be pressurized from a vacuum or an atmospheric pressure to a supercritical pressure state by the supply of the supercritical fluid. The supercritical fluid may be expanded (first expansion) at an end portion of the third supply pipe 23 (i.e., a boundary region between the third supply pipe 23 and the pre-supercritical process zone 130). In one embodiment, the supercritical fluid may be adiabatically expanded during the first expansion. Due to the expansion of the supercritical fluid, a temperature and a pressure of the supercritical fluid may be reduced in the pre-supercritical process zone 130. Since the temperature of the supercritical fluid is reduced, the solubility of the supercritical fluid may be reduced. Even though the supercritical fluid may have high purity (e.g., 99.99%), it may contain a small amount of impurities or particles. The impurities may be condensed by the reduction of the temperature and the reduction of solubility. The condensed impurities may be adsorbed on an inner surface or a wall of the pre-supercritical process zone 130, or the blocking plate 140 may block the condensed impurities such that the condensed impurities may not be moved into the supercritical process zone 120 so as to be piled up in the pre-supercritical process zone 130.

According to some embodiments, in the present disclosure, a supplying device may not just mean the supplying device 30, but may include various structures or elements configured to supply the supercritical fluid to a supercritical process chamber or apparatus.

The supercritical fluid first expanded in the pre-supercritical process zone 130 may be moved into the supercritical process zone 120 through the passage 145. The passage 145 may function as the expansion nozzle, so that the supercritical fluid moved into the supercritical process zone 120 may be expanded again (second expansion). In the present embodiment, the supercritical process zone 120 may be changed into the supercritical state by the limited volumes of the pre-supercritical process zone 130 and the supercritical process zone 120 and/or the continuous supply of the supercritical fluid. As the supercritical fluid is expanded again (second expansion) to cause the impurity condensation phenomenon. However, because the impurities in the supercritical fluid are trapped or filtered by the first expansion of the supercritical fluid in the pre-supercritical process zone 130, it may be possible to substantially reduce the impurity condensation phenomenon caused by the second expansion of the supercritical fluid in the supercritical process zone 120.

In the state that the supercritical process zone 120 is in the supercritical state, the supercritical fluid (e.g., $CO_2$) provided from the supplying device 30 may be supplied into the supercritical process zone 120 through the fourth supply pipe 24 (S2). The supercritical fluid supplied into the supercritical process zone 120 of the supercritical state may maintain the properties of the supercritical fluid. A removal object 112 (e.g., a cleaning solution such as isopropyl alcohol (IPA)) remaining on the substrate 110 may be dissolved by the supercritical fluid, so as to be removed from the substrate 110.

Differently from the present embodiment, if the supercritical fluid is supplied into a process chamber not having the pre-supercritical process zone according to some embodiments of the present disclosure, the temperature and the solubility of the supercritical fluid may be reduced by the expansion of the supercritical fluid. As a result, the impurities in the supercritical fluid may be condensed therein to contaminate the substrate. Additionally, the reduction of the solubility of the supercritical fluid may cause deterioration of its drying ability. However, according to the present embodiment, because the supercritical fluid may be first supplied into the pre-supercritical process zone 130 to filter the impurities, the supercritical process zone 120 may be maintained in the cleaned supercritical state. As a result, since the supercritical process zone 120 may be in the supercritical state by the first supply of the supercritical fluid, it may be possible to substantially reduce the rapid expansion of the supercritical fluid and/or rapid reduction of the solubility of the supercritical fluid during the second supplying of the supercritical fluid.

If the drying process is finished, the supercritical fluid containing the removal object 112 may be exhausted from the process chamber 10 through the exhaust pipe 26 (E). According to the present embodiment, the exhaust pipe 26 may be connected to the pre-supercritical process zone 130. Thus, the supercritical fluid containing the removal object 112 may be moved into the exhaust pipe 26 from the supercritical process zone 120 via the pre-supercritical process zone 130. At this time, a contaminant (e.g., the condensed impurities) existing in the pre-supercritical process zone 130 may be exhausted along with the supercritical fluid. In an embodiment, since the third supply pipe 23 as the supply path of the supercritical fluid to the pre-supercritical process zone 130 is equipped separately from the exhaust pipe 26 as the exhaust path of the supercritical fluid containing the contaminator, the third supply pipe 23 may be cleanly maintained.

[Modified Examples of a Process Chamber]

FIGS. 1D to 1J are cross-sectional views illustrating modified examples of the process chamber of FIG. 1B.

Figure 1D:
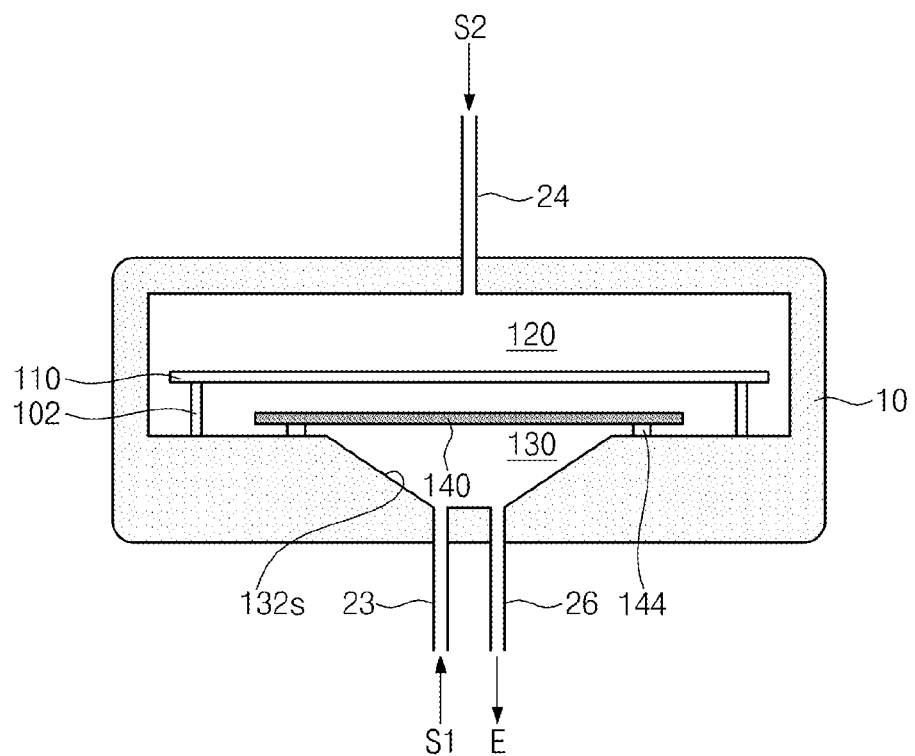
FIGS. 1D to 1J are cross-sectional views illustrating modified examples of the process chamber of FIG. 1B.

Referring to FIG. 1D, a pre-supercritical process zone 130 may have a downwardly inclined sidewall 132s toward the third supply pipe 23 and/or the exhaust pipe 26. Thus, the pre-supercritical process zone 130 may have a funnel-shape, such that it may be possible to smoothly and/or effectively exhaust the supercritical fluid and the condensed impurities.

Figure 1E:
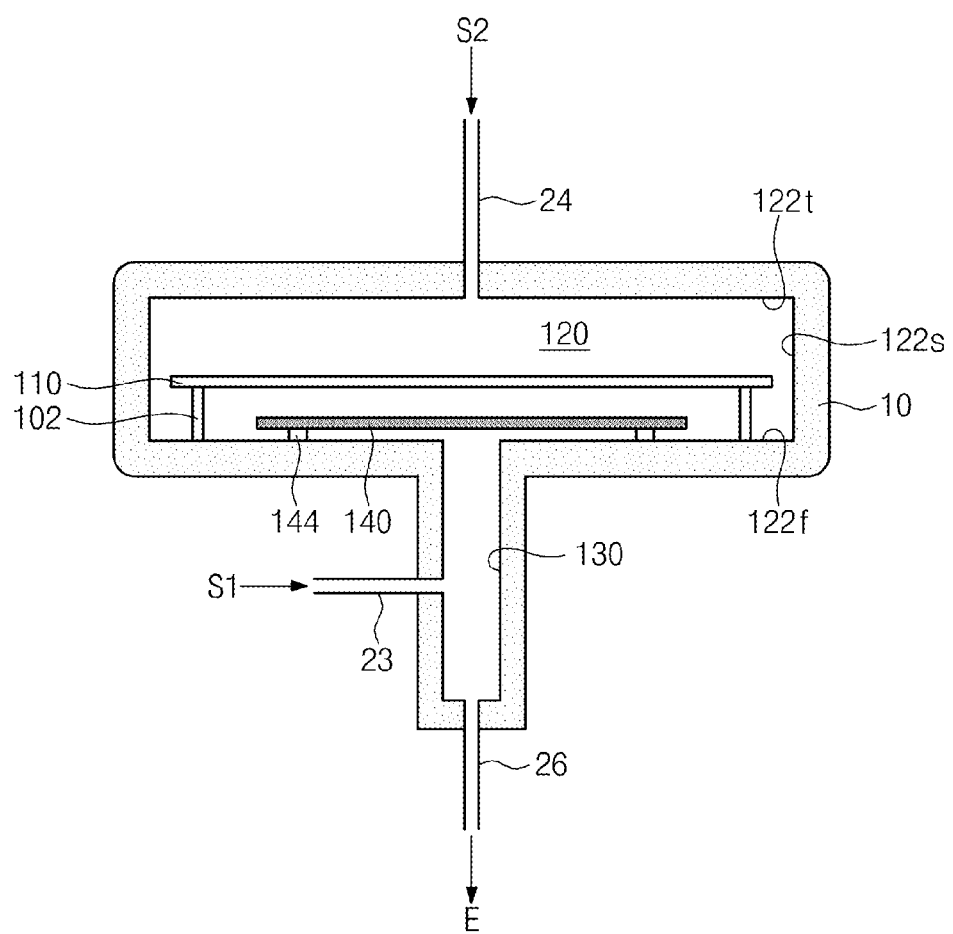

Referring to FIG. 1E, a pre-supercritical process zone 130 may be a narrow duct or passageway that is recessed from the bottom surface 122f of the supercritical process zone 120 and extends downward. The third supply pipe 23 may be connected to a sidewall of the pre-supercritical process zone 130, and the exhaust pipe 26 may be connected to a bottom surface of the pre-supercritical process zone 130. Thus, the condensed impurities may be smoothly and/or effectively exhausted. Moreover, the condensed impurities may be substantially prevented from being moved to the third supply pipe 23. In another embodiment, the pre-supercritical process zone 130 may extend upwardly from the top surface 122t or laterally from either one or both of the sidewall 122s of the supercritical process zone 120.

Figure 1F:
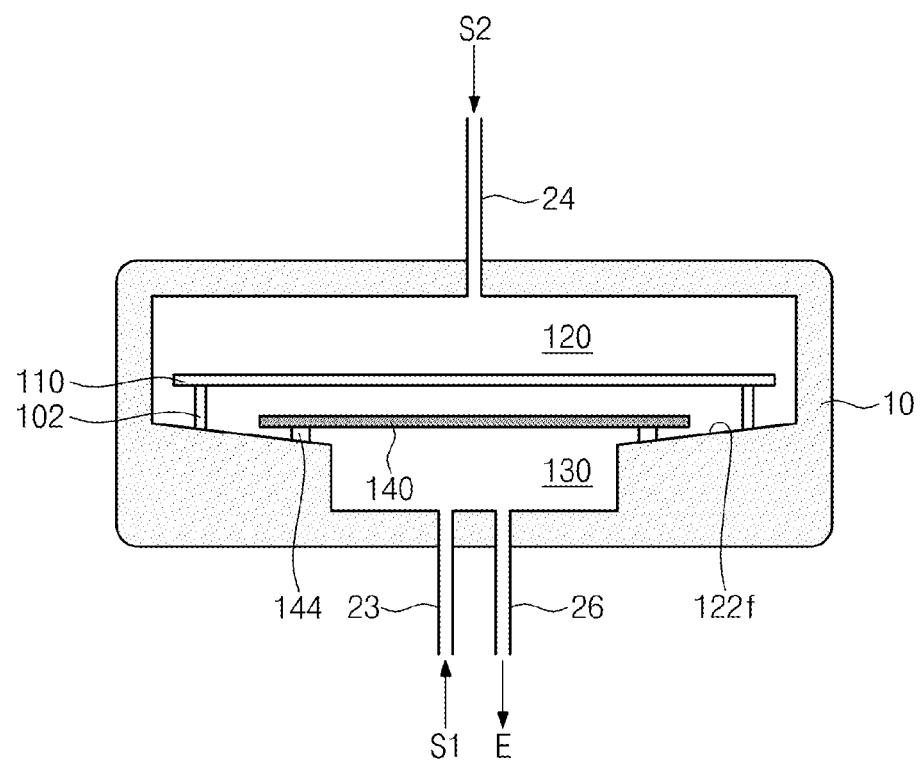

Referring to FIG. 1F, a bottom surface 122f of the supercritical process zone 120 may be inclined downward to the pre-supercritical process zone 130. Due to the downwardly inclined bottom surface 122f, it may be possible to smoothly and/or effectively supply the supercritical fluid to the supercritical process zone 120. The supercritical fluid may be smoothly and/or effectively exhaust to the pre-supercritical process zone 120 due to the inclined bottom surface 122f.

Figure 1G:
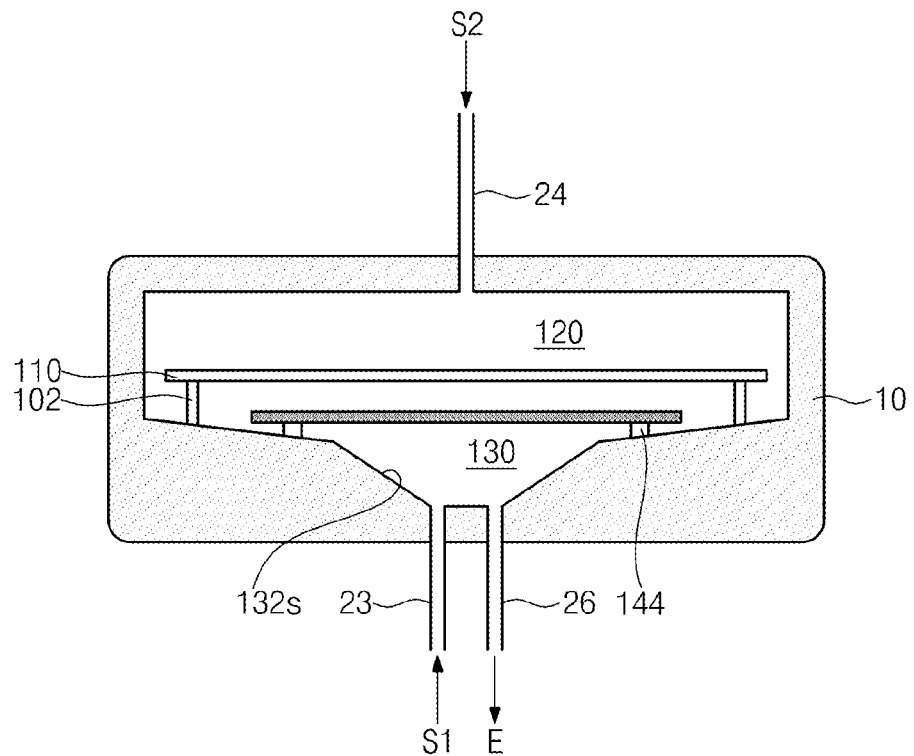

Referring to FIG. 1G, the supercritical process zone 120 may have the inclined bottom surface 122f downward to the pre-supercritical process zone 130, and the pre-supercritical process zone 120 may have the downwardly inclined sidewall 132s to the third supply pipe 23 and/or the exhaust pipe 26. A gradient of the bottom surface 122f of the supercritical process zone 120 may be substantially equal to or different from a gradient of the sidewall 132s of the pre-supercritical process zone 130. Thus, the supercritical process zone 120 and the pre-supercritical process zone 130 may have funnel-shapes, such that it may be possible to perform the smooth and/or effective supplying and exhausting of the supercritical fluid.

Figure 1H:
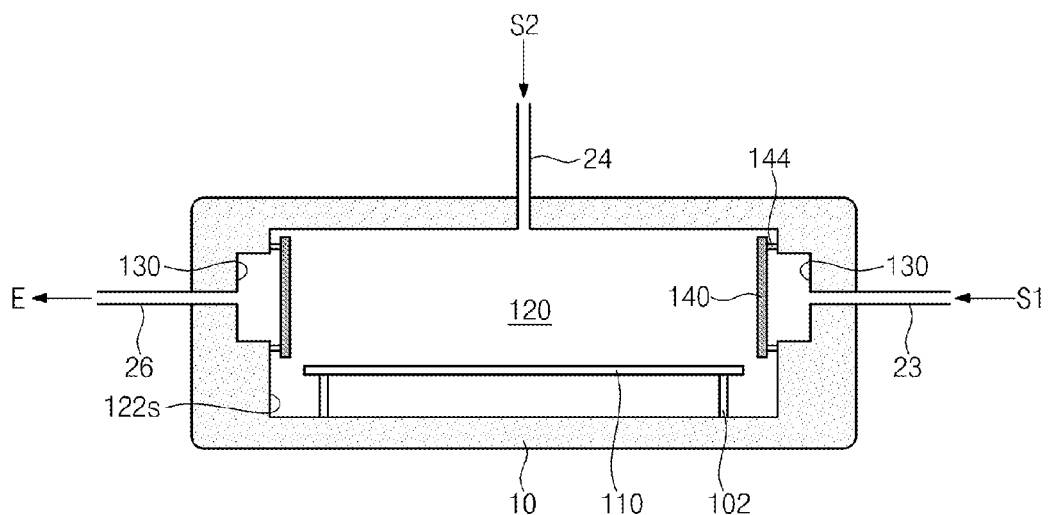

Referring to FIG. 1H, a pre-supercritical process zone 130 may have a ring-shape surrounding the sidewall 122s of the supercritical process zone 120. The third supply pipe 23 and the exhaust pipe 26 may face each other with the supercritical process zone 120 therebetween. For example, the third supply pipe 23 may be connected to a right sidewall of the supercritical process zone 120, and the exhaust pipe 26 may be connected to a left sidewall of the supercritical process zone 120. In another embodiment, the third supply pipe 23 and the exhaust pipe 26 may be connected to the right sidewall or left sidewall of the supercritical process zone 120 together.

Figure 1I:
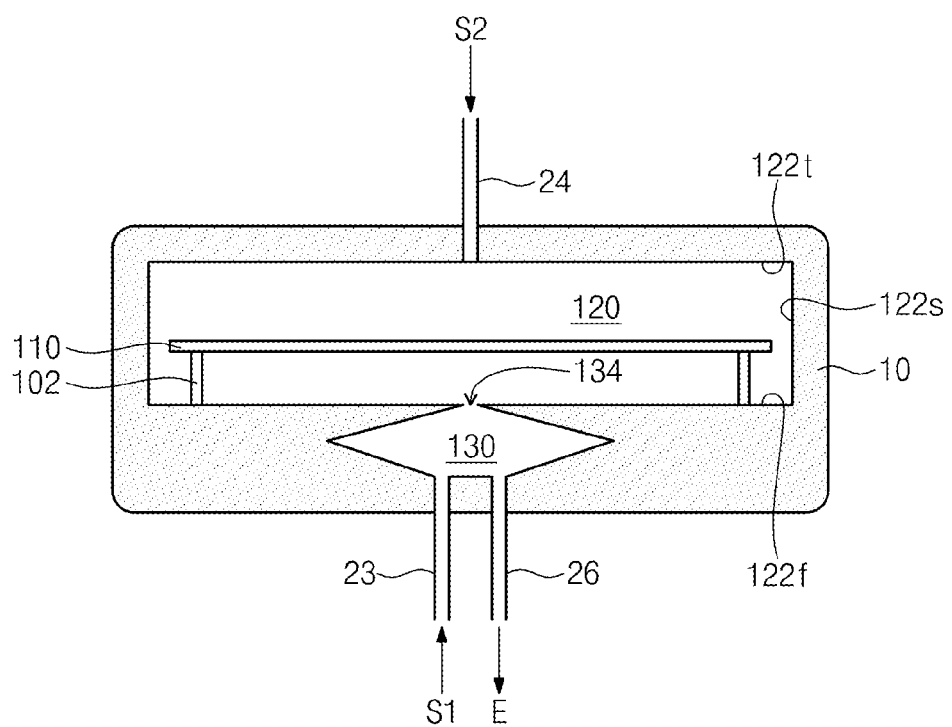

Referring to FIG. 1I, a pre-supercritical process zone 130 may have a diamond-shape formed under the bottom surface 122f of the supercritical process zone 120. The pre-supercritical process zone 130 may have a passage 134 opened toward the supercritical process zone 120. The passage 134 may function as the expansion nozzle. Thus, the substrate treatment system 1 according to the present modified example may not require the blocking plate 140 and the supporting parts 144 described in FIG. 1B. In another embodiment, the pre-supercritical process zone 130 according to the present modified example may be formed under the top surface 122t or the sidewall 122s of the supercritical process zone 120. The pre-supercritical process zone 130 may have one of various shapes such as a circular shape, a rhombus shape, an elliptic shape, and a polygonal shape except the diamond-shape.

Figure 1J:
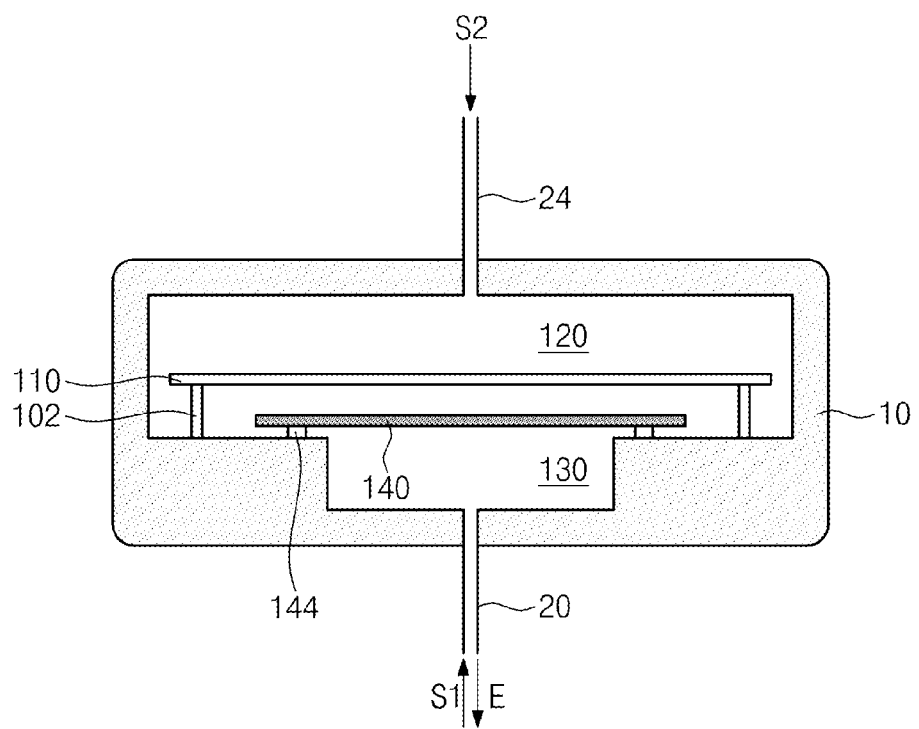

Referring to FIG. 1J, a process chamber 10 may include a single pipe 20 connected to the pre-supercritical process zone 130. The one pipe 20 may function as the third supply pipe 23 and the exhaust pipe 26 described above. For example, the single pipe 20 may be provided as a supply pipe of the supercritical fluid for creating the supercritical state, and be provided as an exhaust pipe of the supercritical fluid after the supercritical process.

[Other Embodiments of a Substrate Treatment System]

Figure 2A:
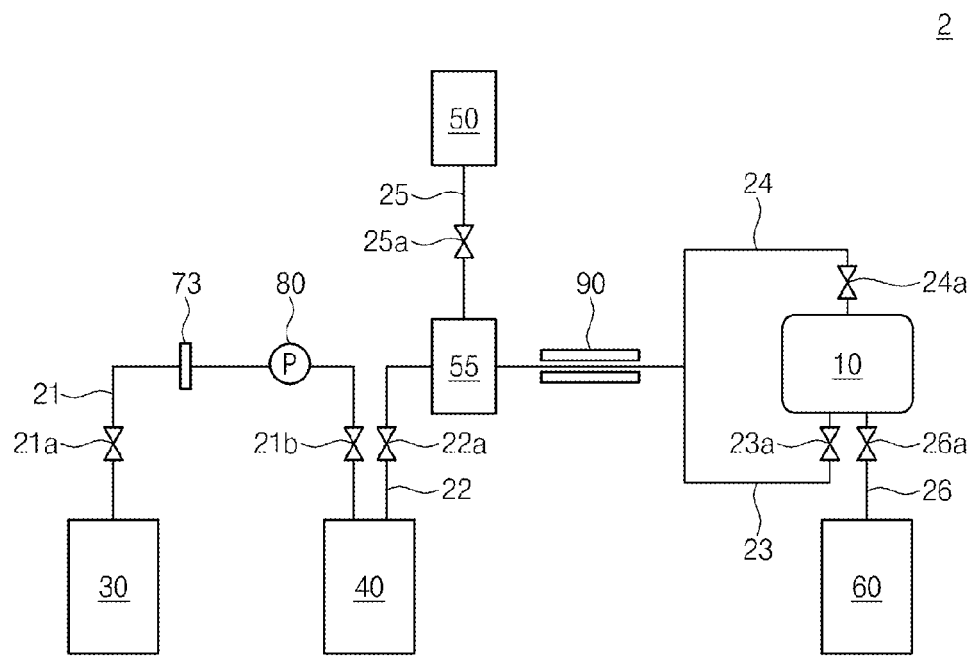
FIG. 2A is a schematic diagram illustrating a substrate treatment system according to another embodiment of the inventive concept.
Figure 2B:
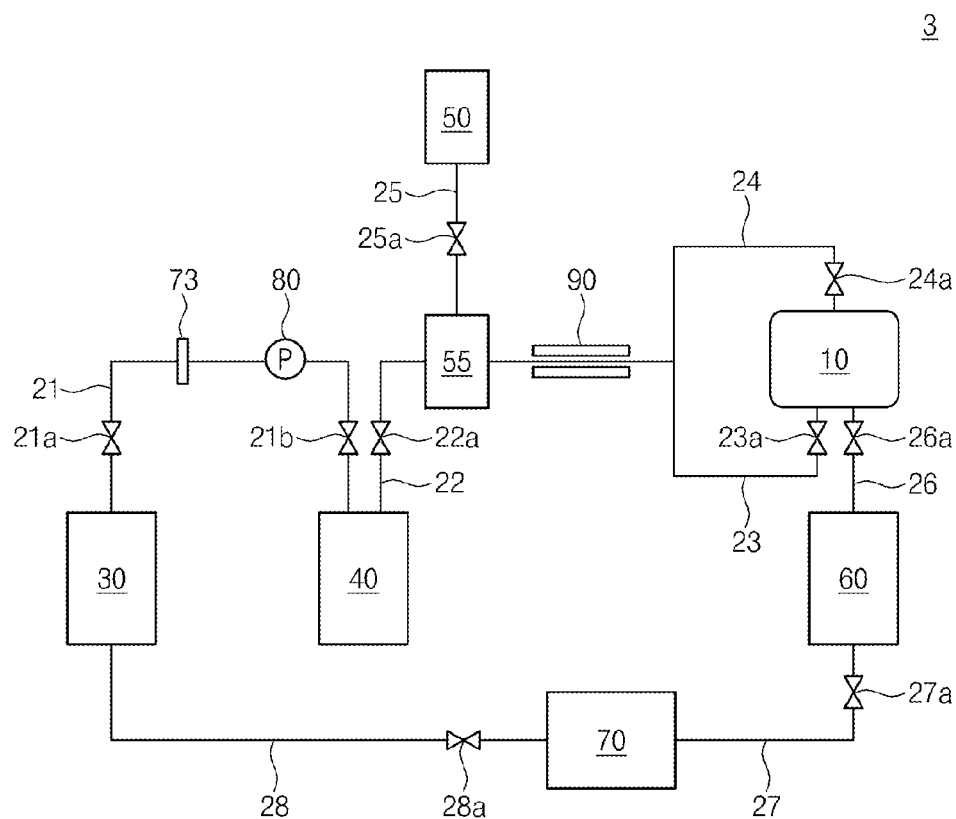
FIG. 2B is a schematic diagram illustrating a substrate treatment system according to still another embodiment of the inventive concept.

FIG. 2A is a schematic diagram illustrating a substrate treatment system according to another embodiment of the inventive concept. FIG. 2B is a schematic diagram illustrating a substrate treatment system according to still another embodiment of the inventive concept.

Referring to FIG. 2A, a substrate treatment system 2 according to the present embodiment may include the elements of the substrate treatment system 1 illustrated in FIG. 1A. Additionally, the substrate treatment system 2 may further include a storage tank 50 for storing a co-solvent and a mixing device 55 for mixing the supercritical fluid and the co-solvent. The co-solvent may include a cleaning fluid and/or an etching fluid mixed with the supercritical fluid. The mixing device 55 may be installed at the second supply pipe 22, and the storage tank 50 may provide the co-solvent into the mixing device 55 through a fifth supply pipe 25 at which a valve 25a is installed. In another embodiment, the mixing device 55 may be installed at the first supply pipe 21 or the fourth supply pipe 24. The substrate treatment system 2 may be provided with multiple storage tanks 50. One of the storage tanks 50 may store the cleaning fluid, and another of the storage tanks 50 may store the etching fluid. Thus, the substrate treatment system 2 may perform various supercritical processes such as a drying process, a cleaning process, and an etching process.

In an embodiment, if the co-solvent is a cleaning fluid, a supercritical cleaning fluid including the supercritical fluid (e.g., $CO_2$) and the cleaning fluid (e.g., IPA) may be supplied into the process chamber 10 to perform a supercritical cleaning process. For example, referring to FIGS. 1B and 2A, the supercritical fluid may be supplied into the pre-supercritical process zone 130 through the third supply pipe 23, so that the supercritical state may be created in the supercritical process zone 120. The supercritical cleaning fluid may be supplied into the supercritical process zone 120 of the supercritical state through the fourth supply pipe 24, thereby cleaning the substrate 110. The supercritical drying process described above may further be performed after the supercritical cleaning process.

In another embodiment, if the co-solvent is the etching fluid, a supercritical etching fluid including the supercritical fluid (e.g., $CO_2$) and the etching fluid (e.g., HF) may be supplied into the process chamber 10 to perform a supercritical etching process. For example, referring to FIGS. 1B and 2A, the supercritical fluid may be supplied into the pre-supercritical process zone 130 through the third supply pipe 23, so that the supercritical state may be created in the supercritical process zone 120. The supercritical etching fluid may be supplied into the supercritical process zone 120 of the supercritical state through the fourth supply pipe 24, thereby etching a structure formed on the substrate 110. The supercritical drying process and/or the supercritical cleaning process described above may further be performed after the supercritical etching process.

Referring to FIG. 2B, a substrate treatment system 3 according to the present embodiment may include the elements of the substrate treatment system 2 illustrated in FIG. 2A. Additionally, the substrate treatment system 3 may further include a regenerating device 70. The regenerating device 70 may be connected to a recovery pipe 28 at which a valve 27*a* is installed. The regenerating device 70 may be provided with a supercritical fluid from a recovery device 60 and provide a regenerated fluid of a liquid state to the supplying device 30 through a regeneration pipe 28 at which a value 28*a* is installed. For example, the regenerating device 70 may make the supercritical fluid into a fluid of a gas state and then separate contaminants from the fluid of the gas state. Additionally, the regenerating device 70 may condense the fluid of the gas state to form the fluid of the liquid state.

[Still Another Embodiment of a Substrate Treatment System]

Figure 3A:
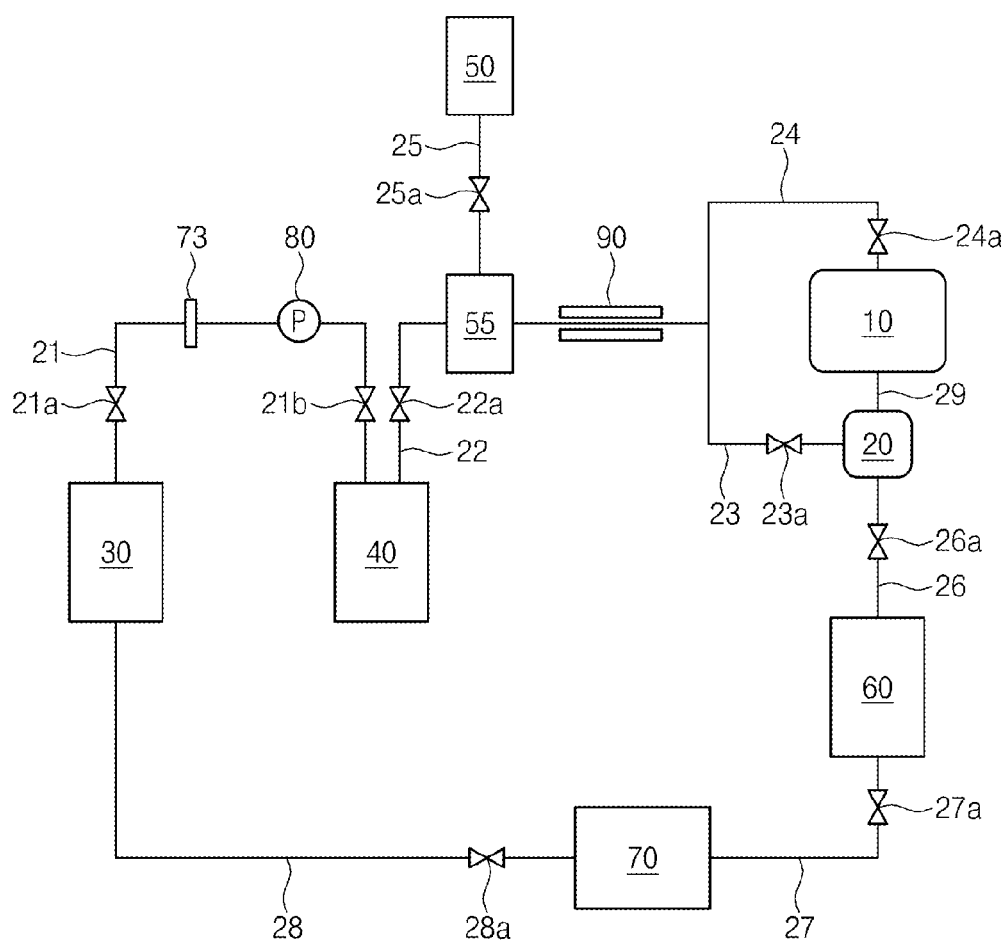
FIG. 3A is a schematic diagram illustrating a substrate treatment system according to even another embodiment of the inventive concept.
Figure 3B:
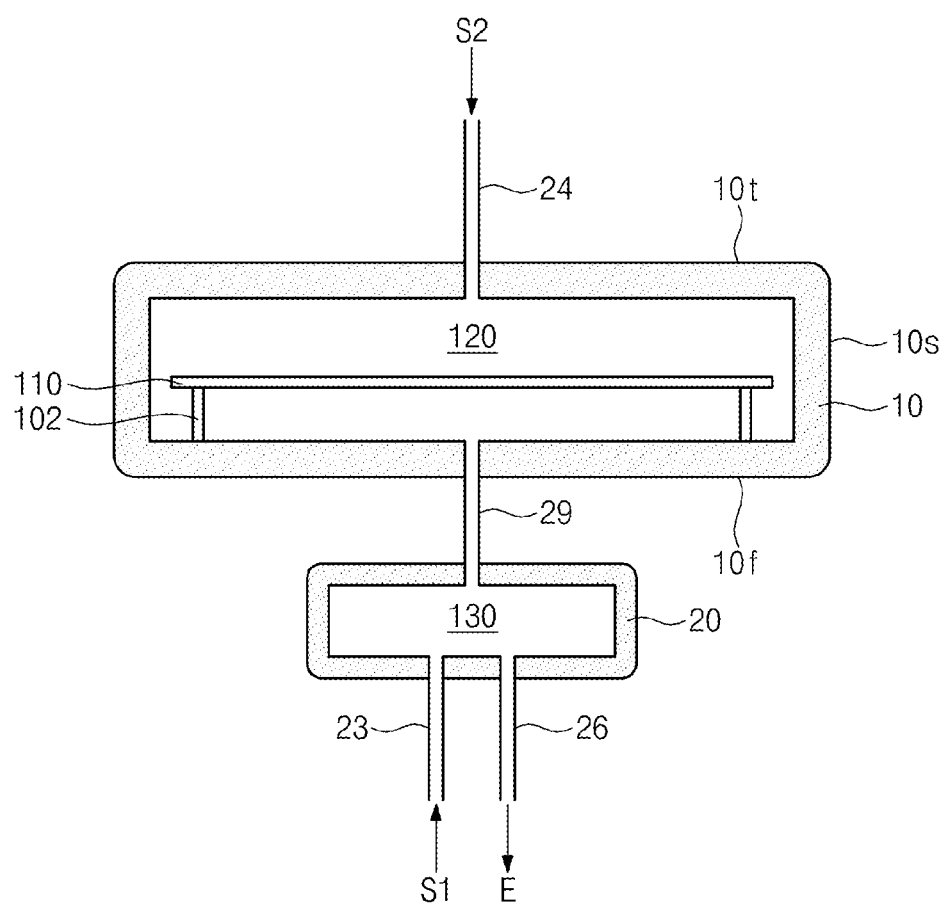
FIG. 3B is a cross-sectional view illustrating a process chamber and an expansion chamber in a substrate treatment system according to even another embodiment of the inventive concept.

FIG. 3A is a schematic diagram illustrating a substrate treatment system according to still another embodiment of the inventive concept. FIG. 3B is a cross-sectional view illustrating a process chamber and an expansion chamber in a substrate treatment system according to even another embodiment of the inventive concept.

Referring to FIG. 3A, a substrate treatment system 4 may include a process chamber 10 in which the supercritical process is performed, an expansion chamber 20 in which the supercritical fluid is pre-expanded, and a middle pipe 29 installed between the process chamber 10 and the expansion chamber 20. The supercritical fluid pre-expanded in the expansion chamber 20 may be supplied into the process chamber 10 through the middle pipe 29. The exhaust pipe 26 may be installed between the expansion chamber 20 and the recovery tank 60. Other elements of the substrate treatment system 4 may be the same as or similar to the elements corresponding thereto in one of the substrate treatment systems 1 to 3 described above.

Referring to FIG. 3B, the process chamber 10 may include the supercritical process zone 120, and the expansion chamber 20 may include the pre-supercritical process zone 130. The expansion chamber 20 may be spaced apart from a bottom wall 10*f* of the process chamber 10. Alternatively, the expansion chamber 20 may be spaced apart from a top wall 10*t* or a sidewall 10*s* of the process chamber 10.

The third supply pipe 23 may be connected to the expansion chamber 20 to supply a supercritical fluid into the pre-supercritical process zone 130 (S1), and the fourth supply pipe 24 may be connected to the process chamber 10 to supply a supercritical fluid into the supercritical process zone 120 (S2). The middle pipe 29 may supply the supercritical fluid pre-expanded in the pre-supercritical process zone 130 into the supercritical process zone 120. Thus, the supercritical process zone 120 may be in the supercritical state.

After the supercritical process, the supercritical fluid containing the contaminants may be moved into the expansion chamber 20 from the process chamber 10 through the middle pipe 29 and then be exhausted from the expansion chamber 20 through the exhaust pipe 26 along with condensed impurities in the pre-supercritical process zone 130 (E).

According to the present embodiment, because the pre-supercritical process zone 130 is separated from the process chamber 10, it may be possible to substantially reduce the movement of the condensed impurities, which are generated by the expansion of the supercritical fluid, from the pre-supercritical process zone 130 to the supercritical process zone 120. Thus, a degree of cleanness of the supercritical process zone 120 may be enhanced.

[Yet Another Embodiment of a Substrate Treatment System]

Figure 4A:
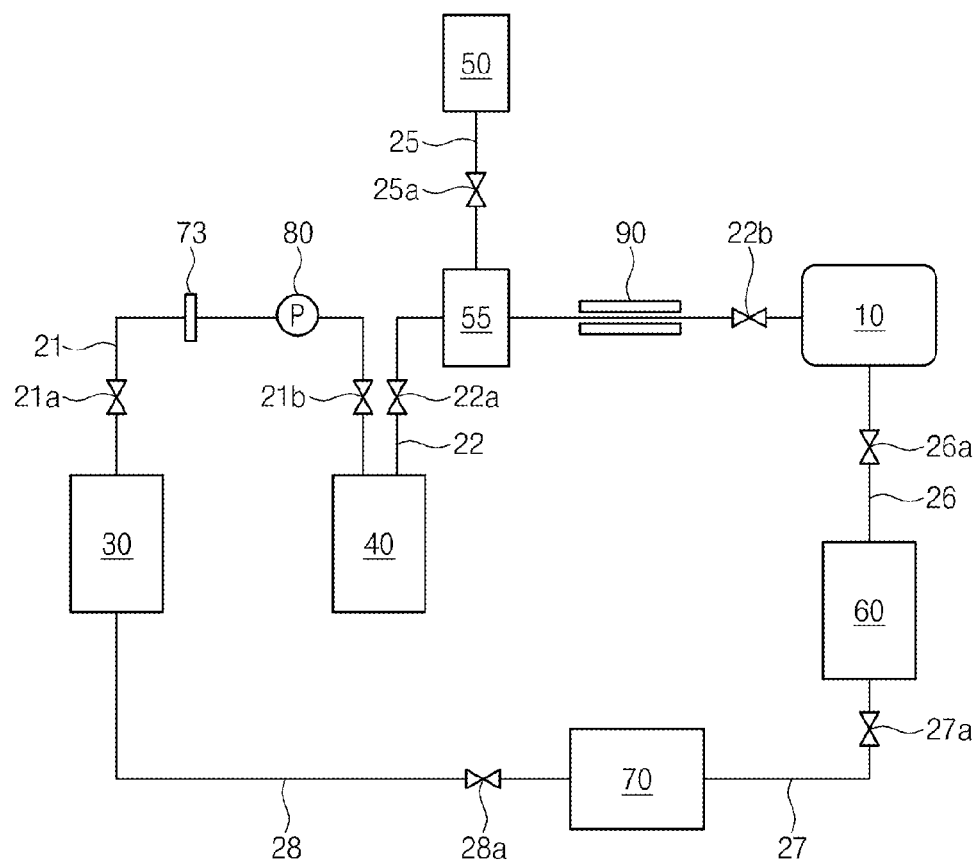
FIG. 4A is a schematic diagram illustrating a substrate treatment system according to yet another embodiment of the inventive concept.
Figure 4B:
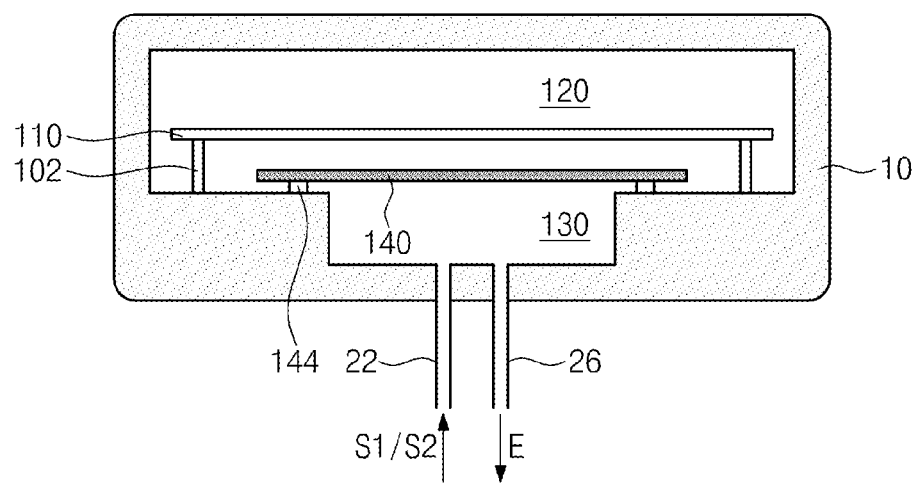
FIG. 4B is a cross-sectional view illustrating a process chamber and an expansion chamber in a substrate treatment system according to yet another embodiment of the inventive concept.

FIG. 4A is a schematic diagram illustrating a substrate treatment system according to yet another embodiment of the inventive concept. FIG. 4B is a cross-sectional view illustrating a process chamber and an expansion chamber in a substrate treatment system according to yet another embodiment of the inventive concept.

Referring to FIGS. 4A and 4B, a substrate treatment system 5 may include a second supply pipe 22 connected to the pre-supercritical process zone 130 of the process chamber 10. Valves 22*a* and 22*b* are installed at the second supply pipe 22. A flow of the supercritical fluid in the second supply pipe 22 may be controlled by the valve 22*b* adjacent to the process chamber 10. According to the present embodiment, the supercritical fluid may be supplied once to perform the supercritical process, or the supercritical fluid may be supplied twice to perform the supercritical process.

For example, the supercritical fluid may be supplied into the pre-supercritical process zone 130 through the second supply pipe 22 (S1), and then the supercritical fluid filtered in the pre-supercritical process zone 130 may be supplied into the supercritical process zone 120 to make the supercritical state in the supercritical process zone 120. In this case, the supercritical process may be performed without the second supply of the supercritical fluid. In other words, the supercritical process may be performed with only the first supply of the supercritical fluid. Also, the first and second supplies of the supercritical fluid can be done in a single supply pipe.

Alternatively, the supercritical fluid may be supplied (first supply) to make the supercritical state in the supercritical process zone 120 (S1), and the supercritical fluid may be additionally supplied (second supply) into the pre-supercritical process zone 130 to perform the supercritical process (S2).

Figure 5A:
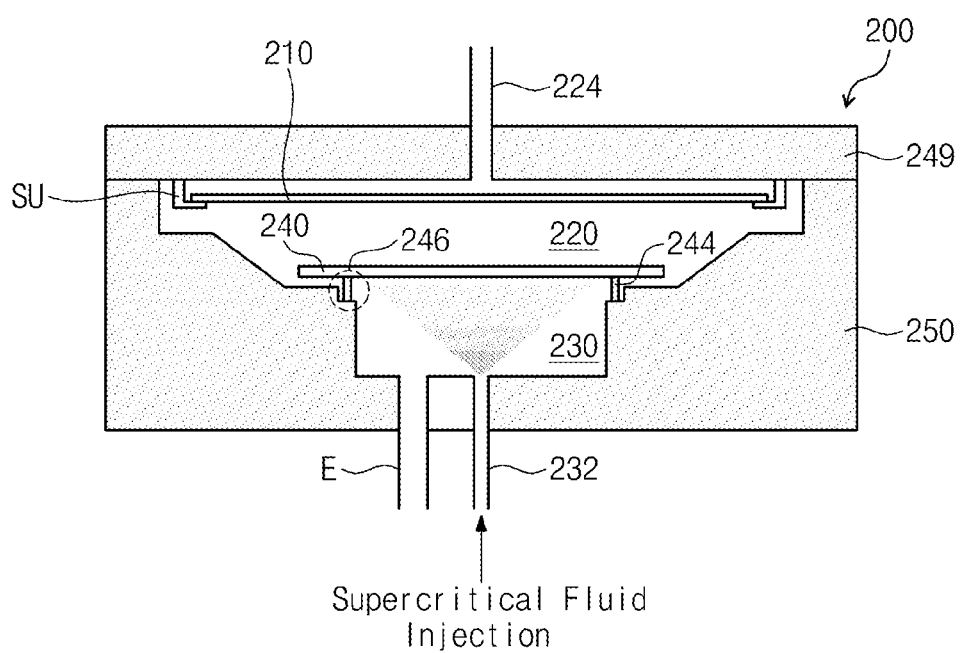
FIGS. 5A-5C are cross-sectional views illustrating a process chamber during different stages of a supercritical process according to some embodiments of the present disclosure.

In some embodiments, as shown in FIG. 5A, a substrate treatment system may include an apparatus or process chamber 200 for performing a supercritical process described above. The apparatus or process chamber 200 can include a pre-supercritical process zone 230 configured to receive a supercritical fluid therein and a supercritical process zone 220 in fluid communication with the pre-supercritical process zone 230. As in the previous embodiments, the supercritical process zone 220 is configured to enable treating a substrate or wafer 210 therein using the supercritical fluid. The pre-supercritical process zone 230 may be arranged and structured to permit expansion of the supercritical fluid before the supercritical fluid reaches the supercritical process zone 220, and the pre-supercritical process zone 230 and the supercritical process zones 220 divided (e.g., physically) from each other.

In one embodiment, the pre-supercritical process zone 230 and the supercritical process zones 220 may be divided from each other with one or more passages configured therebetween to provide fluid communication between the pre-supercritical process zone 230 and the supercritical process zone 220. The passages may be passages 145 shown in FIG. 1C.

Figure 5B:
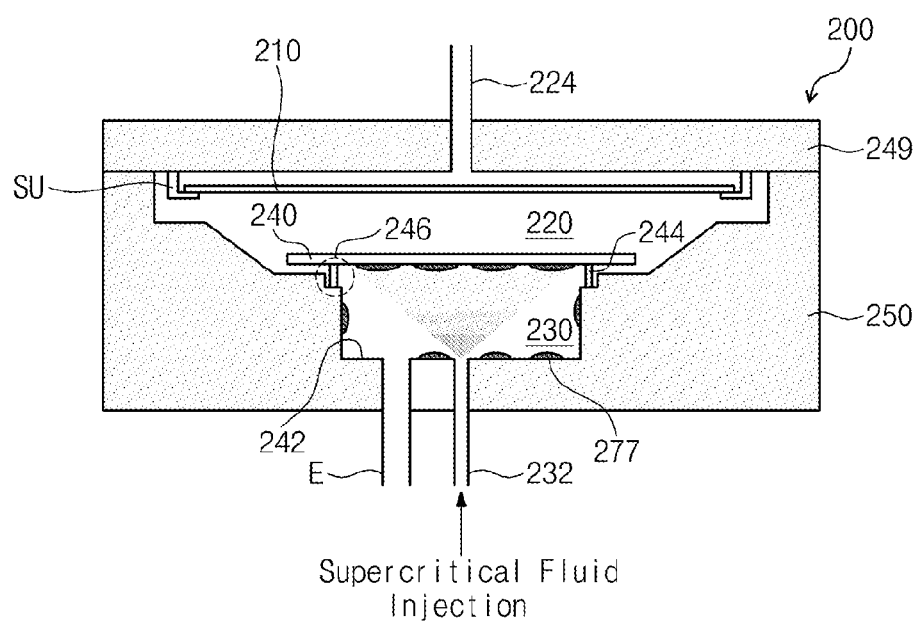

As shown in FIG. 5B, impurities or particles 277 contained in the supercritical fluid are condensed or deposited during the expansion such that a substantial portion of the impurities 277 are confined or restricted within the pre-supercritical process zone 230. More particularly, a substantial portion of the impurities in the supercritical fluid may adhere to a wall defining the pre-supercritical process zone 230.

In one embodiment, a bottom portion 250 of the process chamber 200 is recessed to define the pre-supercritical process zone 230. The pre-supercritical process zone 230 and the supercritical process zone 220 are physically divided from each other by a blocking plate 240. The blocking plate 240 may have a circular shape in plan view similar to the blocking plate shown in FIG. 1C.

In some embodiments, the process chamber 200 has supporting parts 244 disposed along a circumferential edge of the blocking plate 240 to support the blocking plate 240 a predetermined distance above a bottom surface 242 of the pre-supercritical process zone 230 similar to the embodiments discussed above, e.g., FIG. 1C. The supporting parts 244 are spaced apart from each other. The supporting parts 244 may each be a post or pillar.

Figure 5C:
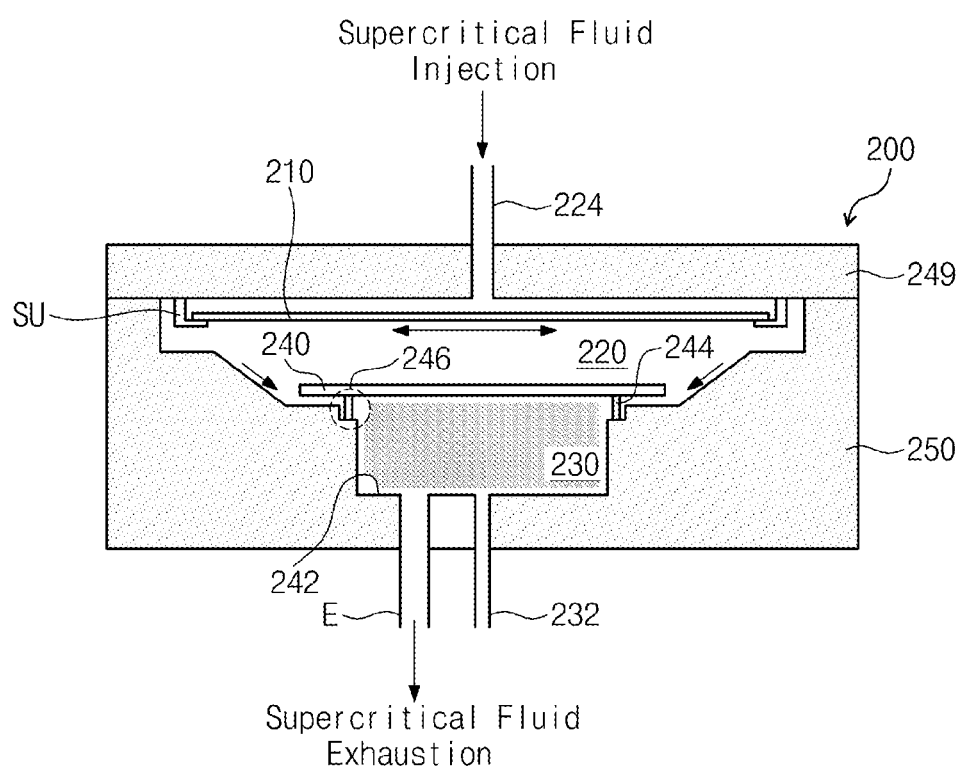

In one embodiment, as shown in FIGS. 5A-5C, a step region 246 may be defined between the pre-supercritical process zone 230 and the supercritical process zone 220. The supporting parts 244 may be disposed within the step region 246 such that the supporting parts 244 can be stably affixed to the process chamber 200.

Although in the previous embodiments, the substrate has been described as being supported by supporting pins or lift pins; in some alternative embodiments, a substrate 210 may be supported by a supporting unit SU extending downwardly from a top portion 249 of the process chamber 20.

Figure 5D:
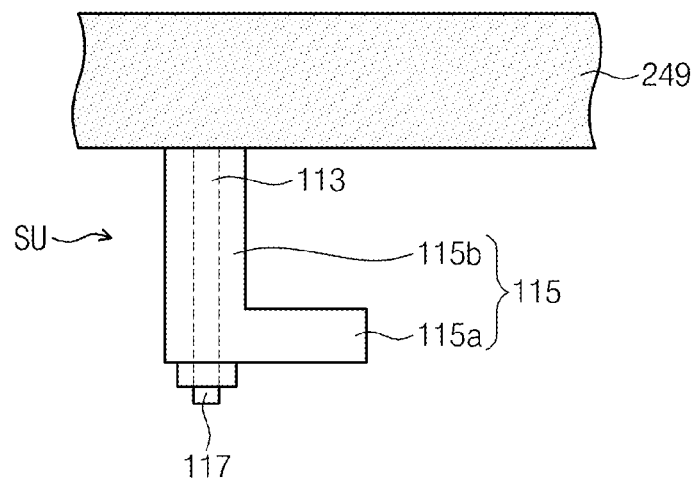
FIG. 5D illustrates a magnified cross-sectional view of a supporting unit SU according to one embodiment.

FIG. 5D illustrates a magnified cross-sectional view of a supporting unit SU according to one embodiment. Referring to FIG. 5D, the supporting unit SU may have a support member 115 and a support pin 113. The support member 115 can have an extension member 115b and an arm or ledge member 115a that extends therefrom to support the substrate 210. The support pin 113 can extend through the extension member 115b of the support member 115 to affix the support member 115 to the top portion 249 of the process chamber 200. The support pin 113 can, for instance, include a bolt that extends through the support member 115 into the top portion 249 of the process chamber 200. The support pin 113 may be welded to the top portion 249 of the process chamber 200. A nut 117 can be threaded onto an end of the bolt below the support member 115 to secure the support member 115 in place. The support member 115 of the supporting unit SU can be replaced after a certain period of use without replacing the whole supporting unit SU. The equipment can therefore be easily and efficiently maintained.

Figure 6:
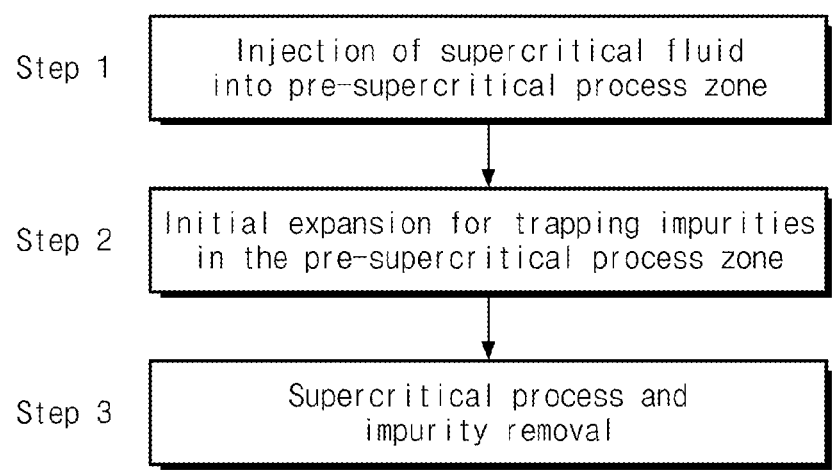
FIG. 6 is a flow chart illustrating a method of treating a substrate using a supercritical fluid according to some embodiments of the present disclosure.

FIG. 6 illustrates a method of treating a substrate using a supercritical fluid according to some embodiments discussed above. The method can include providing or injecting a supercritical fluid into a pre-supercritical process zone in a manner (Step 1) as shown in FIG. 5A. The supercritical fluid is expanded to condense or deposit impurities 277 in the pre-supercritical process zone 230. This expansion may be substantially confined or restricted to occurring within the pre-supercritical process zone 230, as illustrated for example in FIG. 5B.

The supercritical fluid may be injected or provided through a first supply pipe (see, for example, 232 of FIG. 5A) into the pre-supercritical process zone 230, thereby creating a supercritical state in the supercritical process zone 220. The supercritical fluid may then be supplied through the first supply pipe or a second supply pipe (see, e.g., element 224 of FIG. 5C) into the supercritical process zone 220 of the process chamber in the supercritical state. As a result, a substantial portion of the impurities contained in the supercritical fluid can be removed from the supercritical fluid in the pre-supercritical process zone 230 before the supercritical fluid reaches the supercritical process zone 220. This can thereby significantly reduce impurities or particles which might otherwise be undesirably adhered to the substrate 210.

More particularly, impurities contained in the supercritical fluid may be condensed or deposited during the initial expansion of the supercritical fluid, such that they adhere to a wall defining the pre-supercritical process zone (see FIG. 5B). Thus, a substantial portion of the impurities can be trapped in the pre-supercritical process zone.

The substrate 210 in the supercritical process zone 220 may then be treated using the supercritical fluid (Step 3) (see FIG. 5C). More particularly, the supercritical fluid provided or injected into the supercritical process zone 220 in the supercritical state treats (e.g., through a drying or cleaning process) the substrate 210. Also, any impurities condensed in the supercritical process zone due to the expansion of the supercritical fluid therein are dissolved by the used supercritical fluid and exhausted through an exhaust pipe E (see, e.g., FIG. 5C).

In another embodiment, a method of treating a substrate in a treatment apparatus having a pre-supercritical process zone and a supercritical process zone, can include: providing a first supply of a supercritical fluid into the pre-supercritical process zone to trap impurities in the pre-supercritical process zone by permitting expansion of the supercritical fluid before the supercritical fluid reaches the supercritical process zone; generating a supercritical state in the supercritical process zone by supplying the expanded supercritical fluid from the pre-supercritical process zone to the supercritical process zone; and treating a substrate in the supercritical process zone using the supercritical fluid.

Figure 7:
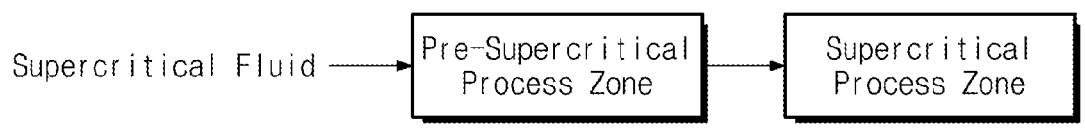
FIG. 7 is a diagram illustrating inventive concepts.

In summary, as illustrated in FIG. 7, by injecting a supercritical fluid into a pre-supercritical process zone and permitting expansion of the supercritical fluid confined in the pre-supercritical process zone before the supercritical fluid reaches a supercritical process zone or chamber, a substantial portion of impurities or particles can be effectively trapped in the pre-supercritical process zone and removed from the supercritical fluid. As a result, even if the supercritical fluid is expanded again (second expansion) in the supercritical process zone, the condensation problem discussed above can be substantially reduced. Such inventive concepts can be practiced without necessarily being limited to embodiments discussed above. For example, process chambers having different types or shapes than described above can be used within the spirit and scope of the present disclosure.

Figure 8:
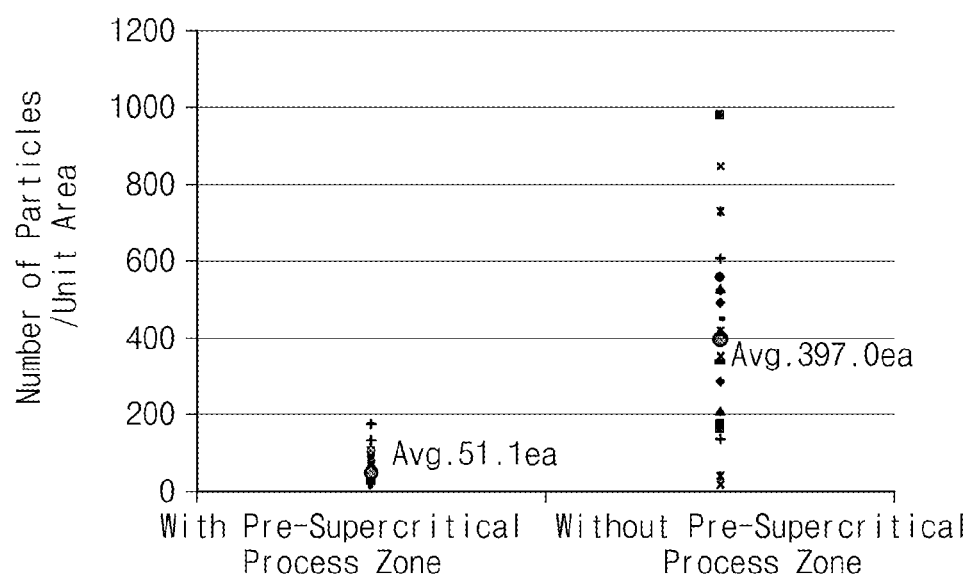
FIG. 8 is a graph showing effects of inventive concepts.

With such novel inventive concepts, the applicant of the present application has found that a number of particles or impurities occurring on a unit area of a semiconductor wafer during a supercritical process has been significantly reduced as shown in FIG. 8.

Throughout the specification, features shown in one embodiment may be incorporated in other embodiments within the spirit and scope of the inventive concept.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Various operations may be described as multiple discrete steps performed in a manner that is most helpful in understanding the invention. However, the order in which the steps are described does not imply that the operations are order-dependent or that the order that steps are performed must be the order in which the steps are presented.

With respect to the use of substantially any plural and/or singular terms herein, those having skill in the art can translate from the plural to the singular or from the singular to the plural as is appropriate to the context and/or application. The various singular/plural permutations may be expressly set forth herein for sake of clarity.

According to some embodiments of the inventive concept, the supercritical state is created in the chamber before the supercritical process is performed. Thus, the properties of the supercritical fluid may be maintained during the supercritical process, so that the substrate treating ability may be improved. Additionally, it is possible to prevent the substrate from being contaminated and to prevent the treating ability of the supercritical fluid from being deteriorated. The structure of the chamber may be changed for gathering particles caused from the supercritical fluid, so that particle management ability and substrate treating yield may be improved. Additionally, the condensed impurities may be exhausted along the supercritical fluid, so that the cleaned degree of the chamber may be improved. As a result, it is possible to prevent the substrate from being contaminated and to easily manage maintenance of the substrate treatment system.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. An apparatus for treating a substrate, the apparatus including:
    a process chamber whose bottom portion is recessed to form a recess therein, the process chamber including:
        a pre-supercritical process zone to receive a supercritical fluid therein, the recess defining a substantial portion of the pre-supercritical process zone;
        a supercritical process zone in fluid communication with the pre-supercritical process zone, the supercritical process zone configured to enable treating a substrate therein using the supercritical fluid;
        a blocking plate to cover the pre-supercritical process zone; and
        a plurality of supporting parts to support the blocking plate, the plurality of supporting parts disposed outside the recess,
    wherein the pre-supercritical process zone is arranged and structured to permit expansion of the supercritical fluid before the supercritical fluid reaches the supercritical process zone, and
    wherein the pre-supercritical process zone and the supercritical process zone are divided from each other by the blocking plate.

2. The apparatus of claim 1, wherein impurities contained in the supercritical fluid are condensed or deposited during the expansion such that a substantial portion of the impurities are confined within the pre-supercritical process zone.

3. The apparatus of claim 2, wherein the substantial portion of the impurities contained in the supercritical fluid are adhered to a wall defining the pre-supercritical process zone.

4. The apparatus of claim 1, wherein the blocking plate has a circular shape in plan view.

5. The apparatus of claim 4, wherein the supporting parts are disposed along a circumferential edge of the blocking plate to support the blocking plate a predetermined distance above a bottom surface of the pre-supercritical process zone, the supporting parts spaced apart from each other.

6. The apparatus of claim 5, wherein a step region is defined between the pre-supercritical process zone and the supercritical process zone, and wherein the supporting parts are disposed within the step region.

7. The apparatus of claim 5, wherein one or more passages are defined by the blocking plate, a surface of the pre-supercritical process zone, and the supporting parts.

8. The apparatus of claim 1, wherein the plurality of supporting parts extend along a circumferential edge of the blocking plate and spaced apart from each other such that one or more passages are defined between the plurality of supporting parts, the one or more passages acting as an expansion nozzle through which the supercritical fluid is expanded while moving into the supercritical process zone from the pre-supercritical process zone.

* * * * *